United States Patent
Mathieu et al.

[11] Patent Number: 5,602,385
[45] Date of Patent: Feb. 11, 1997

[54] TWO WAVE BAND RADIATION DETECTOR HAVING TWO FACING PHOTODETECTORS AND METHOD FOR MAKING SAME

[75] Inventors: Lydie Mathieu, Voreppe; Francois Marion; Christian Lucas, both of Saint Egreve, all of France

[73] Assignee: Commissariat a l'Energie Atomique, Paris, France

[21] Appl. No.: 341,072

[22] Filed: Nov. 17, 1994

[30] Foreign Application Priority Data

Nov. 23, 1993 [FR] France .................................. 93 13992

[51] Int. Cl.⁶ ...................................................... G01J 3/50
[52] U.S. Cl. .................. 250/226; 250/214.1; 250/214 R; 250/370.06; 250/338.4
[58] Field of Search ............................ 250/214 R, 214.1, 250/208.1, 216, 226, 339.02, 370.09, 332, 339.01, 339.05, 349, 370.06, 370.08, 338.4

[56] References Cited

U.S. PATENT DOCUMENTS

| | | | |
|---|---|---|---|
| 3,962,578 | 6/1976 | Roschen | 250/370.06 |
| 4,651,001 | 3/1987 | Harada et al. | 250/370.06 |
| 5,239,179 | 8/1993 | Baker | 250/339.02 |
| 5,300,777 | 4/1994 | Goodwin | 250/338.4 |
| 5,391,881 | 2/1995 | Jeuch et al. | 250/370.09 |

FOREIGN PATENT DOCUMENTS

| | | |
|---|---|---|
| 0087842 | 9/1983 | European Pat. Off. . |
| 0281011 | 9/1988 | European Pat. Off. . |
| 0475525 | 3/1992 | European Pat. Off. . |
| 3533146 | 3/1987 | Germany . |

OTHER PUBLICATIONS

Patent Abstracts of Japan, vol. 12, No. 285 (E–642), Aug. 4, 1988 & JP-A-63 062 266, Mar. 18, 1988.

Primary Examiner—Stephone Allen
Attorney, Agent, or Firm—Oblon, Spivak, McClelland, Maier & Neustadt, P.C.

[57] ABSTRACT

A radiation detector which senses two wave bands and a process for making this detector. A first substrate includes a first photodetection element sensitive to a first wave band. A second substrate contains a second photodetection element which is sensitive to a second wave band. The second substrate is transparent to at least the first wave band. The two photodetection elements are positioned facing each other. The substrates are interconnected by conductive spheres.

11 Claims, 2 Drawing Sheets

FIG. 1A PRIOR ART
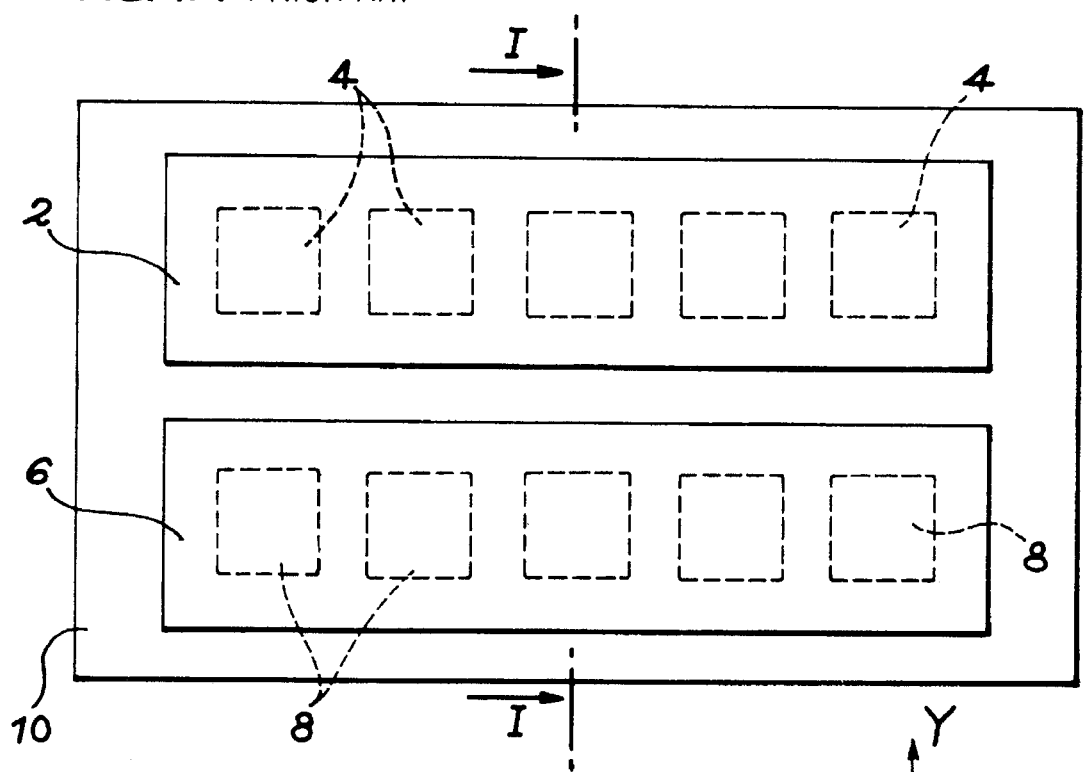
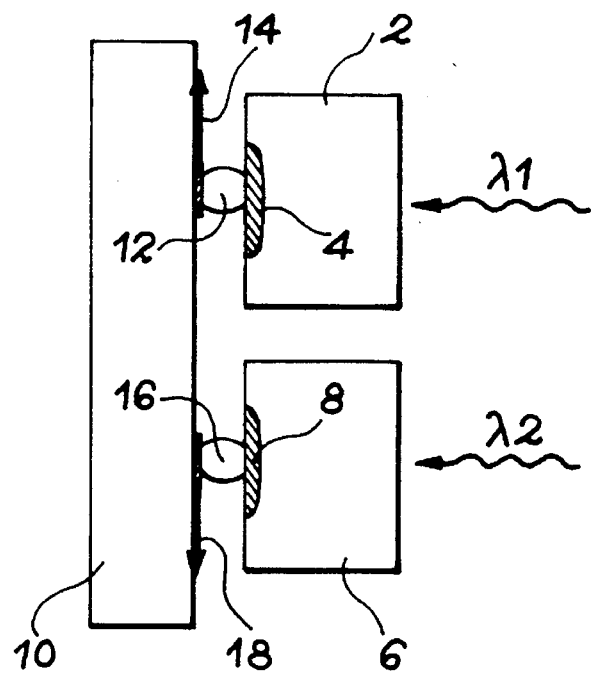
FIG. 1B PRIOR ART

TWO WAVE BAND RADIATION DETECTOR HAVING TWO FACING PHOTODETECTORS AND METHOD FOR MAKING SAME

BACKGROUND OF THE INVENTION

1. Field of the Invention

The present invention relates to a detector of radiation in two wave bands, as well as to a process for the production of said detector. The invention is particularly applicable to thermal imaging.

2. Discussion of the Background

It is known that thermal imaging permits a representation of objects by their thermal emissions. The energy emitted by an object is dependent on two quantities, namely the emissivity $\epsilon o$ and the temperature To of the object.

A thermal measurement performed in two wave bands makes it possible, by resolving an equation having two unknowns, to determine To and $\epsilon o$. Therefore imaging systems able to read two spectral bands are of great interest in thermal imaging.

Detectors of radiation in two wave bands, also known as two-colour detectors, are known in connection with the production of bispectral cameras. Such a camera, constituted by an AGA THV 780 bispectral analyser operating in the band from 3 to 5.5 µm and in the band from 8 to 12 µm is described in the book entitled "Thermographie infrarouge" by G. Gaussorgues, TEC and Doc, Editions Lavoisier.

In this known analyser, the two analysis channels are spatially separated at the optical means of the analyser, which in fact results from the juxtaposing of the two cameras.

The present invention solves the problem of the positioning, in a tolerance cube and as close to one another as possible, of two photodetection elements or detection pixels, which are respectively sensitive to two separate wavelength ranges.

It is a question of spatially locating these pixels in a tolerance volume perfectly determined in accordance with three axes X,Y and Z perpendicular to one another.

The known microelectronics methods do not make it possible to form "planar" pixels on the same substrate.

SUMMARY OF THE INVENTION

In order to solve the above problem, it is known to respectively produce the pixels on separate substrates and then cut up the thus obtained detection circuits and mechanically assemble them by juxtaposing them, as is diagrammatically illustrated in FIGS. 1A and 1B.

FIGS. 1A and 1B show a detection circuit constituted by an array 2 of photodetectors 4 and another detection circuit constituted by another array 6 of photodetectors 8, said photodetectors 4 and 8 being e.g. formed by photodiodes. These arrays 2 and 6 are arranged in contiguous manner and are assembled on the same substrate 10 by the flip-chip method.

FIG. 1A is a plan view of the resulting assembly, whereas FIG. 1B is section I—I of FIG. 1A.

Defining the axes X,Y and Z, the axis X is parallel to the photodetector arrays, the axis Y is perpendicular to the axis X and parallel to the plane of the substrate 10 carrying the arrays 2 and 6 and the axis Z is perpendicular to the axes X and Y.

Electrically conductive microspheres 12 make it possible to establish an electrical connection between the photodetectors 4 and connection conductors 14 associated therewith on the substrate 10 and other electrically conductive microspheres 16 make it possible to establish a connection between the photodetectors 8 and other connection conductors 18 associated therewith on the substrate 10.

The array 2, in which are formed the photodetectors 4, is sensitive to the radiation belonging to a first wavelength range centered on a wavelength $\lambda 1$.

The array 6, in which are formed the photodetectors 8, is sensitive to the radiation belonging to a second wavelength range centered on a wavelength $\lambda 2$ and separate from the first range.

In this way an assembly of photodetectors 4 and 8 is obtained and said photodetectors are contiguous and appropriate for reading in two wavelength ranges, the reading of the arrays 2 and 6 taking place by scanning along the axis Y.

In the known assembly diagrammatically shown in FIGS. 1A and 1B, the photodetectors of the array 2 are very remote from the photodetectors of the array 6 (along the axis Y) and this distance imposes numerous electronic corrections concerning the reading of the arrays and causes optical problems due to the larger size of the focal plane.

The present invention aims at solving the aforementioned problem whilst considerably reducing the number of electronic reading corrections.

More specifically, the present invention relates to a detector of radiation in two wave bands, said detector comprising:

a first substrate in which is formed at least one first photodetection element, which is sensitive to radiation belonging to a first wave band, a second substrate on which is formed at least one second photodetection element, which is sensitive to radiation belonging to a second wave band, characterized in that the second substrate provided with the second photodetection element is transparent at least to the first wave band and in that the first photodetection element is positioned facing the second photodetection element in the vicinity of the latter and in that the first and second substrates are interconnected by electrical and/or mechanical connection spheres.

These spheres are used for the mechanical connection of the substrates or the electrical connection of the photodetection elements or at the same time for said electrical and mechanical connections.

According to a special embodiment of the invention, the second substrate is not photoconductive and transparent to the first and second wave bands.

According to a second embodiment, the second substrate is photoconductive and simply transparent to the first wave band.

The first substrate may or may not be photoconductive.

Thus, there are four possibilities, namely the second substrate can be photoconductive or not and, in both cases, the first substrate may or may not be photoconductive.

The invention makes it possible to superimpose, within a very small tolerance range, two detection pixels, which are respectively sensitive to separate wavelength ranges.

According to a special embodiment of the detector according to the invention, the first substrate has a plurality of first photodetection elements, the second substrate has a plurality of second photodetection elements, the second photodetection elements being respectively placed facing the first photodetection elements in the vicinity of the latter.

The first substrate can have a row of first photodetection elements, whilst the second substrate has a row of second photodetection elements.

According to a preferred embodiment of the detector according to the invention, it also comprises a support provided with a recess able to receive the second substrate and which has a first electrical connection conductor for each first photodetection element and a second electrical connection conductor for each second photodetection element, each first photodetection element being connected to the corresponding first electrical connection conductor by means of a first electrically conductive sphere, each second photodetection element being connected to the corresponding second electrical connection conductor by means of the second and third electrically conductive spheres, which are themselves connected to one another by means of a third electrical connection conductor with which the first substrate is provided.

Each first photodetection element can be sensitive to radiation belonging to a first wave band of the infrared range, each second photodetection element then being sensitive to the radiation belonging to a second wave band also of the infrared range.

The present invention also relates to a process for the production of the detector according to the invention and incorporating said support, said process being characterized in that it comprises the following stages:

manufacture takes place of said support provided with said recess, manufacture takes place of said first substrate carrying each first photodetection element and provided, for each first photodetection element, with said first, second and third electrically conductive spheres, manufacture takes place of said second substrate carrying each second photodetection element, assembly takes place of the first substrate and the support by connecting each first conductor to the corresponding first photodetection element by means of the first corresponding sphere and by connecting each second conductor to the third corresponding conductor by means of the corresponding second sphere and assembly takes place of the second substrate and the thus obtained assembly, having the first substrate and the support, by connecting each second photodetection element to the corresponding third sphere.

BRIEF DESCRIPTION OF THE DRAWINGS

The invention is described in greater detail hereinafter relative to non-limitative embodiments and with reference to the attached drawings, wherein show:

FIG. 1A a diagrammatic plan view of a known detector of radiation in two wave bands and which has already been described.

FIG. 1B the section I—I of FIG. 1A and which has already been described.

DISCUSSION OF THE PREFERRED EMBODIMENT

Figure 2A:
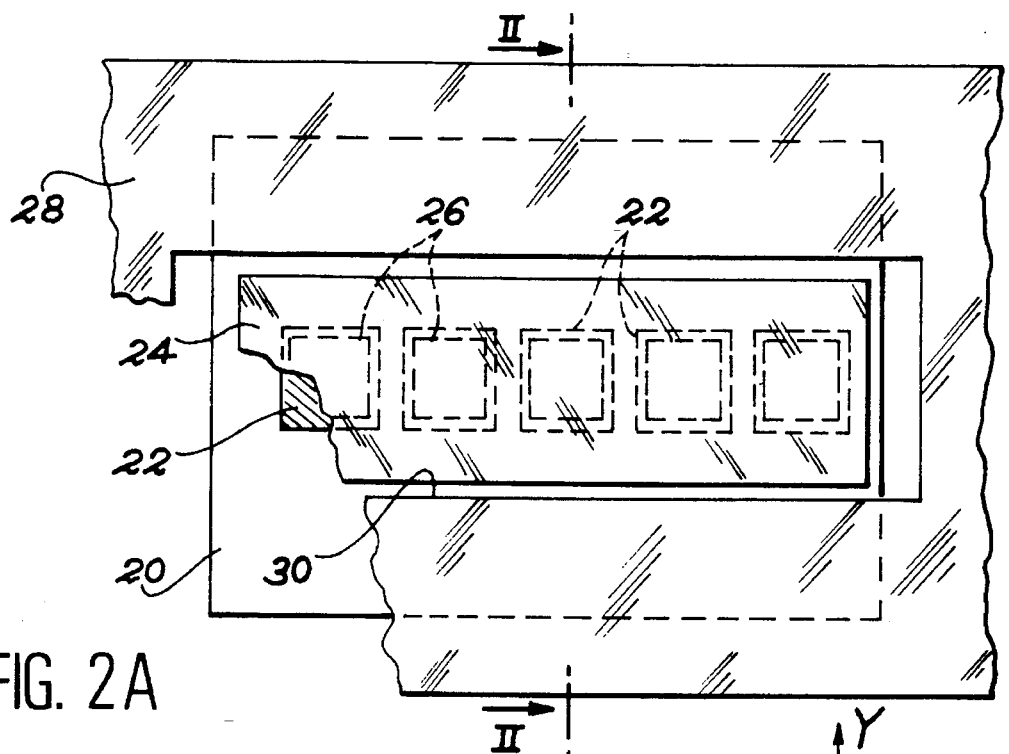
FIG. 2A a diagrammatic plan view of a detector according to the invention.
Figure 2B:
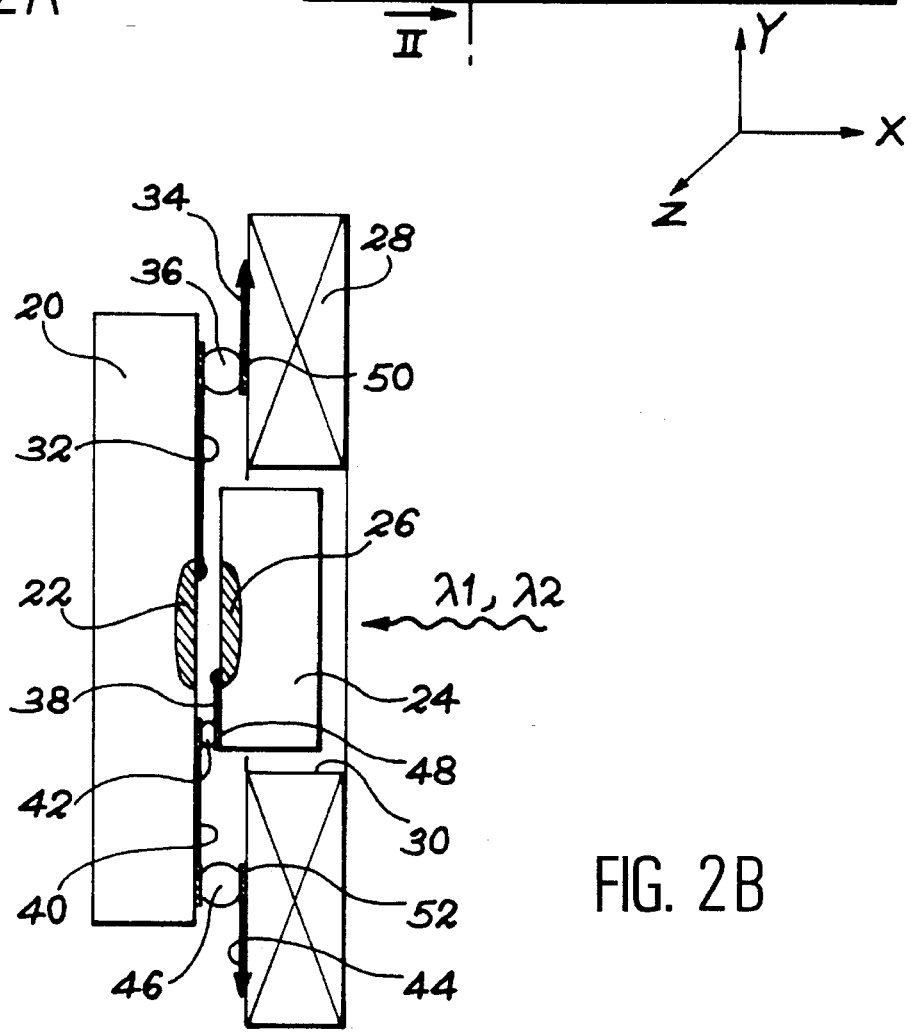
FIG. 2B the section II—II of FIG. 2A.

The detector according to the invention and diagrammatically shown in FIGS. 2A and 2B comprises:
a first array 20 having a row of photodetectors 22 sensitive to radiation belonging to one wavelength range, which is centered on a wavelength $\lambda 1$, a second array 24 having a row of photodetectors 26 sensitive to radiation belonging to another wavelength range centered on a wavelength $\lambda 2$ differing from $\lambda 1$ and an interconnection network support 28 on which the array 20 is hybridized by the spheres in accordance with the flip-chip method.

The photodetectors 22 and 26 are e.g. photoconductors, photodiodes or MIS capacitors.

The support 28 is provided with a recess 30 giving access to the front face of the array 20 following the hybridization thereof on the support (the photodetectors 22 being placed on the side of said front face, as can be seen in FIG. 2B).

The photodetectors 26 of the array 24 are also placed on the side of the front face thereof and said array 24 is hybridized, through the recess 30 of the support 28, on the array 20, face to face, the photodetectors 22 and 26 then being positioned in facing manner in the way shown in FIGS. 2A and 2B.

FIG. 2A shows that the recess 30 is shaped like a rectangle, whose width exceeds that of the array 24 and whose length exceeds that of said array 24.

The use of a hybridization by electrically conductive spheres makes it possible, bearing in mind the size of said spheres which can have a diameter of approximately 5 to 10 µm, to place photodetectors 26 in the immediate vicinity of the photodetectors 22. It is thus possible to have photodetectors 22 and 26 very close to one another, namely at a distance of approximately 5 to 10 m.

These photodetectors 22 and 26 can even be placed in contact with one another if holes are provided in one or other of the arrays 20 and 24 for receiving the spheres permitting the hybridization of the array 24 on the array 20, the formation of said holes being known to one skilled in the art.

Further details will now be given on the hybridization of the array 20 on the support 28 and on the hybridization of the array 24 on the array 20.

As can be seen in FIG. 2B, each photodetector 22 is provided with an electrical connection conductor 32 located on the array 20 and is associated with an electrical connection conductor 34 located on the interconnection network support 28, said conductors 32 and 34 being electrically connected by means of an electrically conductive sphere 36.

FIG. 2B also shows that the photodetector 26 corresponding to said photodetector 22 is provided with an electrical connection conductor 38 (placed on the front face of the array 24) and associated with another connection conductor 40 placed on the array 20. An electrically conductive sphere 42 provides the connection between the conductors 38 and 40.

Another electrical connection conductor 44 is associated with these conductors 38 and 40 and is placed on the interconnection network support 28. Another electrically conductive sphere 46 permits the electrical connection of the conductor 44 to the conductor 40.

The electric signal supplied by each photodetector 22 is transmitted to the corresponding conductor 34 by means of the corresponding conductor 32 and corresponding sphere 36.

In the same way, the electric signal supplied by each photodetector 26 is transmitted to the corresponding conductor 44 by means of the conductor 38, the sphere 42, the conductor 40 and the sphere 46 corresponding thereto. The conductors 34 and 44 supply signals received by them to not shown, electronic processing means.

The wavelength ranges to which the photodetectors 22 and 26 are respectively sensitive e.g. belong to the infrared range (e.g. the range from 3 to 5.5 µm and the range from 8 to 12 µm).

The substrate constituted by the array 24 and in which are formed the photodetectors 26 is not photoconductive and transparent to the said two wavelength ranges.

Thus, an infrared signal in the range centered on λ2 and which illuminates the rear face of the array 24, traverses the latter up to the photodetectors 26, which detect this wavelength range.

An infrared signal in the range centered on λ1 is not stopped by the photodetectors 26 and passes out of the array 24 so as to "illuminate" the photodetectors 22, which detect said signal.

In the case where the substrate of the array 24 is a photoconductor sensitive to the range centered on the wavelength λ2, it is only transparent to the range centered on the wavelength λ1. In this case, as in the case where the said substrate is not photoconductive, the substrate of the array 20 may or may not be photoconductive.

The invention leads to the following advantages:

considering that the axes X and Y are perpendicular to one another and parallel to the planes of the arrays 20,24 and the support 28 and an axis Z is perpendicular to the axes X and Y, the construction of the detector according to the invention shown in FIGS. 2A and 2B leads to a very limited offset (e.g. less than 0.5 μm), along the axes X and Y of the pixels respectively making it possible to detect the two wavelength ranges, said conductor leads to a minimum offset of said pixels along the axis Z, whereby said offset can even be zero, as indicated hereinbefore, the invention makes it possible to produce a detector in three wave bands, also known as a three-colour detector, with detection pixels only very slightly offset along the axis X and only slightly offset along the axis Y, by combining the method described relative to FIGS. 1A and 1B and the present invention.

Thus, it is possible to produce such a three-colour detector by hybridizing an array of photodetectors sensitive to a first wavelength range on an interconnection network support having a recess, by then hybridizing another array of photodetectors sensitive to a second wavelength range on said first array, through the recess and by positioning the photodetectors in front of one another, as shown hereinbefore (FIGS. 2A and 2B) and then by hybridizing a third array of photodetectors sensitive to a third wave band on the first array, alongside the second array and parallel to the latter, through the recess (the latter having appropriate dimensions).

A description will now be given of a process for the production of the detector according to the invention shown in FIGS. 2A and 2B. To produce this detector the first stage is to manufacture the interconnection network support 28 provided with the recess 30. This support can be made from a ceramics material (in which case the recess is machined mechanically) or silicon (in which case the recess is produced by chemical machining).

The production of such a support provided with a recess falls within the scope of one skilled in the art, the production methods for such a perforated circuit being covered by numerous publications.

This is followed by the manufacture of the array 20 from a material known for its response in the spectral range centered on λ1 (use being e.g. made of CdHgTe for a detection in the infrared range).

The manufacture of such an array of photodetectors is also known. The said array is then provided with weld beads of the type used in flip-chip technology. The production of such beads is also known in the art (the welding material undergoes electrolysis or sputtering).

It is pointed out that the array 20 is provided, for each pair of photodetectors 22 and 26, with at least:

the sphere 36 for interconnecting, to the support 28, the photodetector 22 sensitive to the wavelength range centered on λ1, the sphere 42 for interconnecting, to the array 20, the photodetector 26 sensitive to the wavelength range centered on λ2, the sphere 46 for connecting the conductor 40 to the conductor 44.

This is followed by the manufacture of the array 24 in the same way as the array 20 by providing said array 24 with wetting elements 48 which are to be positioned facing the spheres 42.

Using the flip-chip method, hybridization then takes place of the array 20 on the interconnection network support 28, such a hybridization being known and widely used in microelectronics.

It is pointed out in this connection that the support 28 is previously provided with wetting elements 50 and 52 which are to respectively face the spheres 36 and 46. The array 24 is then hybridized on the array 20 through the recess 30 of the support 28.

The present invention applies to the manufacture of multispectral detectors.

These can be scanned two-colour arrays scanned three-colour arrays and even monoelements (in the latter case a first photodetector sensitive to a first wavelength range is positioned facing a second photodetector sensitive to a second wavelength range, e.g. by hybridizing a substrate having the first photodetector on another substrate having the second photodetector through a recess made in a support on which said other substrate has been hybridized).

According to the invention, it is even possible to envisage manufacturing a small two-colour matrix (e.g. of type 4×4 or 8×8), each photodetector then having to be "taken up" by an electrical conductor in order to be brought to the periphery of the matrix.

In the case of FIGS. 2A and 2B, the welding beads or spheres are used as mechanical connections for the arrays and electrical connections to the photodetectors of said arrays.

Other embodiments of the invention are possible in which the weld beads are only used as electrical connections to the photodetectors or only as mechanical connections to the substrates.

We claim:

1. A radiation detector which is sensitive in two wave bands, said detector comprising:

first substrate;

first photodetection element having a front face formed in a first surface of said first substrate, said first photodetection element being sensitive to radiation in a first wave band;

a second substrate;

second photodetection element having a front face formed in a second surface of said second substrate, said second photodetection element being sensitive to radiation in a second wave band;

said second substrate being transparent to at least said first wave band;

said first and second surfaces being adjacent so that the front face of said first photodetection element is faced toward the front face of said second photodetection element; and said first and second substrates being interconnected by conductive connection spheres.

2. Detector according to claim 1, characterized in that the second substrate is not photoconductive and is transparent to the first and second wave bands.

3. Detector according to claim 1, characterized in that the second substrate is photoconductive and only transparent to the first wave band.

4. Detector according to claim 1, characterized in that the first substrate is photoconductive.

5. Detector according to claim 1, characterized in that the first substrate has a plurality of first photodetection elements, in that the second substrate has a plurality of second photodetection elements, the second photodetection elements being respectively placed facing the first photodetection elements in the vicinity of the latter.

6. Detector according to claim 5, characterized in that the first substrate has a row of first photodetection elements and in that the second substrate has a row of second photodetection elements.

7. Detector according to claim 1, characterized in that it also comprises a support provided with a recess able to receive the second substrate and which has a first electrical connection conductor for each first photodetection element and a second electrical connection conductor for each second photodetection element, each first photodetection element being connected to the corresponding first electrical connection conductor by means of a first electrically conductive sphere, each second photodetection element being connected to the corresponding second electrical connection conductor by means of the second and third electrically conductive spheres, which are themselves connected to one another by means of a third electrical connection conductor with which the first substrate is provided.

8. Detector according to claim 1, characterized in that each first photodetection element is sensitive to radiation belonging to a first wave band of the infrared range and in that each second photodetection element is sensitive to radiation belonging to a second wave band also of the infrared range.

9. Detector according to claim 1, wherein the first substrate is not photoconductive.

10. Detector according to claim 1, wherein said conductive spheres have a diameter of approximately 5 to 10 μm, so that the first and second photodetection elements are spaced approximately 5 to 10 μm from each other.

11. Detector according to claim 1, wherein said first and second photodetection elements are in contact with each other and holes are provided in one of said first substrate and said second substrate for receiving said conductive spheres.

* * * * *